United States Patent [19]

Mizushima

[11] Patent Number: 5,091,340
[45] Date of Patent: Feb. 25, 1992

[54] METHOD FOR FORMING MULTILAYER WIRINGS ON A SEMICONDUCTOR DEVICE

[75] Inventor: Kazuyuki Mizushima, Tokyo, Japan

[73] Assignee: NEC Corporation, Japan

[21] Appl. No.: 635,810

[22] Filed: Jan. 2, 1991

Related U.S. Application Data

[63] Continuation of Ser. No. 382,553, Jul. 19, 1989, abandoned.

[30] Foreign Application Priority Data

Jul. 19, 1988 [JP] Japan .................. 63-181008

[51] Int. Cl.$^5$ ........................................ H01L 21/44
[52] U.S. Cl. .................................. 437/194; 437/195; 437/199
[58] Field of Search ............... 437/194, 195, 228, 203, 437/189, 197, 198

[56] References Cited

FOREIGN PATENT DOCUMENTS

| 100748 | 6/1982 | Japan . | |
|---|---|---|---|
| 124246 | 7/1983 | Japan . | |
| 0195845 | 11/1984 | Japan | 437/194 |
| 0043845 | 3/1985 | Japan | 437/195 |

OTHER PUBLICATIONS

"Semiconductor World", No. 10, 1984, pp. 129-133, ibid. No. 3, 1987, pp. 36-42.
"Nikkei Microdevices", No. 1, 1988, p. 19.

*Primary Examiner*—Brian E. Hearn
*Assistant Examiner*—Tvan Nguyen
*Attorney, Agent, or Firm*—Laff, Whitesel, Conte & Saret

[57] ABSTRACT

A wiring method for semiconductor device includes the steps of forming a first seat in a portion where a lower wiring layer and an upper wiring layer are to be connected on a semiconductor substrate provided with semiconductor elements, forming a first conductor composed of an Al or Al-Cu alloy on the whole surface of the semiconductor substrate; forming the lower wiring layer by selectively removing the first conductor simultaneously with the formation of a second seat composed of the first conductor on the first seat; forming by the coating method a glass or organic silicon compound film as an interlevel insulating film, forming a through-hole by photoetching in the portion where the upper and lower wiring layers are to be connected; and forming a second conductor in order to form the upper wiring layer by photoetching.

6 Claims, 2 Drawing Sheets

METHOD FOR FORMING MULTILAYER WIRINGS ON A SEMICONDUCTOR DEVICE

This application is a continuation of application Ser. No. 07/382,553, filed Jul. 19, 1989, abandoned.

BACKGROUND OF THE INVENTION

1. Field of the Invention

The present invention relates to a method for forming wirings on a semiconductor device and, more particularly, to a method of forming multilayer wiring thereon.

2. Description of the Related Art

A description will subsequently be given of a conventional method of forming multilayer wiring in a semiconductor integrated circuit. A wiring conductor such as aluminum is first deposited to form a first-layer wiring by sputtering on a semiconductor substrate provided with semiconductor elements formed thereon, an insulating film such as a CVD $SiO_2$ film grown on the elements and contact holes in the insulating film. The photoetching technique is then used for patterning the wiring conductor for the first-layer wiring including lower wirings, element electrodes and seats for through-holes. Subsequently, an interlevel insulating film is grown by, e.g., the plasma CVD method and through-holes are bored by photoetching above the seats. An upper-layer wiring conductor is thereafter deposited by sputtering and then patterned by photoetching to form upper wirings and connections to the seat of the first-layer wiring through the through-holes, whereby the upper and lower wirings are connected via the through-holes.

In addition to the formation of the interlevel insulating film by the plasma CVD method, there has been proposed, as in Japanese Patent Application Laid-Open Nos. 100748/1982, 124246/1983 and a technical periodic "Semiconductor World", No. 10, 1984, pp 129–133, ibid. No. 3, 1987, pp 36–42, the provision of a multilayer insulating film comprising a glass film formed by the coating method and an insulating film by the CVD method or the provision of an $SiO_2$ film by coating with an organic silicon compound.

In the conventional method of forming the multilayer wiring, however, the unevenness of the sublayer and the lower wiring layer is generally reflected on the surface of a single-phase plasma CVD film when the plasma CVD film is employed as the interlevel insulating film. The film-forming properties in the stepped lower wiring layer portion under the upper wiring layer will be harmfully affected by the lower-layer wiring conductor if it is made more than 1.0 μm thick, which will result in low reliability. In addition, it becomes hardly possible to micronize the wire-to-wire space of the lower wiring layer.

Although the application of the glass film formed by the coating method or that of the organic silicon compound to the whole or part of the interlevel insulating film ensures excellent flatness on condition that the thickness of the film formed by the coating method is set greater than that of the lower wiring layer, the film-coated layer is exposed at the time the through-hole for connecting the upper and lower wiring layers is bored to cause corrosion of the wiring conductors due to outgassing of, e.g., $H_2O$ accompanied by the dehydrating condensation reaction of the coating film therefrom. If the interlevel insulating film is made thick enough to maintain the interlayer insulation, the depth of the through-hole tends to increase; the disadvantage in this case is that the coverage of the through-hole portion in the upper wiring layer deteriorates.

Moreover, there has also been proposed, as in "NIKKEI MICRODEVICES", No. 1, 1988, p 19, a method of forming an upper wiring layer, the method comprising the steps of pre-forming aluminum pillars for connecting upper and lower wirings layers on the lower wiring layer, coating the whole surface with polyimide as an interlevel insulating film and exposing the head of each aluminum pillar by etching. However, this method requires very complicated manufacturing steps.

SUMMARY OF THE INVENTION

It is, therefore, an object of the present invention is to provide a method for forming a multilayer wiring structure having excellent flatness with high reliability.

Another object of the present invention is to provide a simple method for forming a multilayer wiring structure.

A method for forming a semiconductor device according to the present invention comprises the steps of forming a first seat in a portion where a lower wiring layer and an upper wiring layer are to be connected on a semiconductor substrate provided with semiconductor elements, forming a first conductor on the whole surface on the semiconductor substrate to form the lower wiring layer by selective etching simultaneously with a formation of a second seat composed of the first conductor on the first seat, coating a glass or organic silicon compound film as an interlevel insulating film, and forming a second conductor to form the upper wiring layer by selective etching.

The first seat is prearranged in a portion where the through-hole is bored and then the first conductor is formed in order to provide the lower wiring layer and the second seat, whereby the second seat formed in the through-hole portion is made higher than the peripheral lower wiring layer. The application of the film coating to the interlevel flattened insulating film thereafter consequently ensures the provision of excellent coverage for the upper wiring layer, so that multilayer wiring having the connection (through-hole) between the upper and lower wiring layers is readily implemented at a high yield rate with reliability.

DESCRIPTION OF THE PREFERRED EMBODIMENTS

Figure 1A:
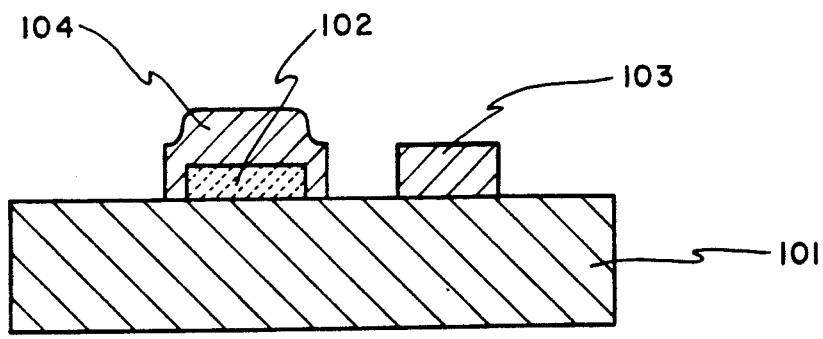
FIGS. 1(A)–(D) are vertical sectional views of a first embodiment of the present invention for illustrating processing steps arranged in order.

In reference to FIG. 1(A), a first conductive film is deposited by sputtering on a semiconductor substrate 101 provided with semiconductor elements. The first conductive film, excluding only a portion where a through-hole for connecting upper and lower wiring layers is to be formed as a seat 102, is removed by photoetching. The first conductive film may be formed of the same material as that for the lower wiring layer, such as Al, Al—Cu alloy and the like. If the thickness of the lower wiring layer is set at about 1.0 μm, the first conductive film may be about 0.5 μm thick.

A second conductive film 0.5-1.0 μm thick as a lower-layer wiring substance is subsequently deposited by sputtering over the whole surface and patterned by photoetching, whereby an element electrode or lower wiring layer 103 and a seat 104 are simultaneously formed. The seat 104 is kept connected to the lower wiring layer 103.

The portion where the through-hole is to be formed becomes a lamination composed of the seats 102, 104 and the height of the surface of the seat 104 is set higher by the thickness of the seat 102 than the lower wiring layer 103.

Figure 1B:
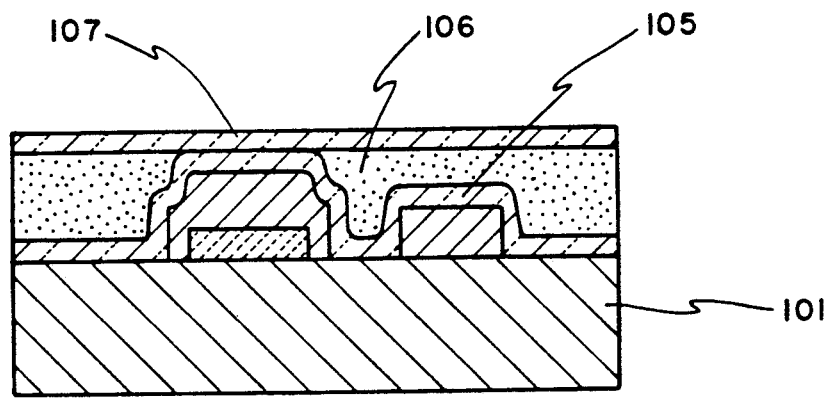

In reference to FIG. 1(B), a silicon nitride or silicon oxide film of 0.2-0.3 μm thick as an interlevel insulating film 105 is grown by plasma chemical vapor deposition. A glass or organic silicon compound film is formed thereon by the coating method and heat-treated for condensation to form a flat interlevel insulating film 106 by the coating method. The thickness of the interlevel insulating film 106 by the coating method is arranged so that the interlevel insulating film 105 on the seat 104 is exposed. Otherwise, the interlevel insulating film 105 is thickly coated with the interlevel insulating film 106 before being etched back by the reactive ion-etching method until the interlevel insulating film 105 is exposed.

An interlevel insulating film 107 of 0.2-0.3 μm thick is subsequently grown likewise using the same material.

The interlevel insulating film 106 is thus formed by the coating method in such a manner that it does not exist in the portion where the through-hole is to be bored but exists above the lower wiring layer 103.

Figure 1C:
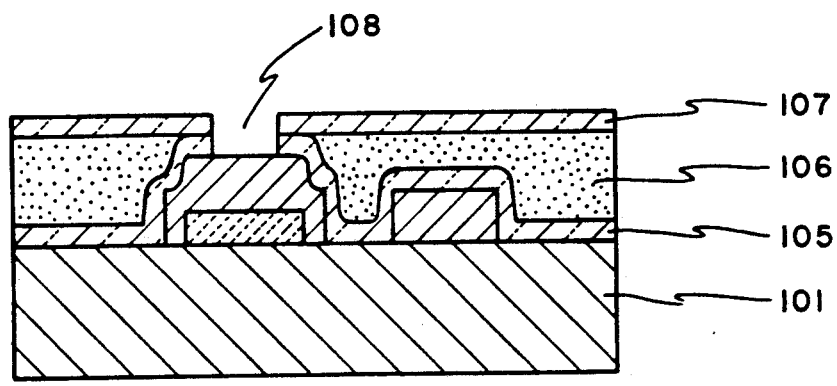
Figure 1D:
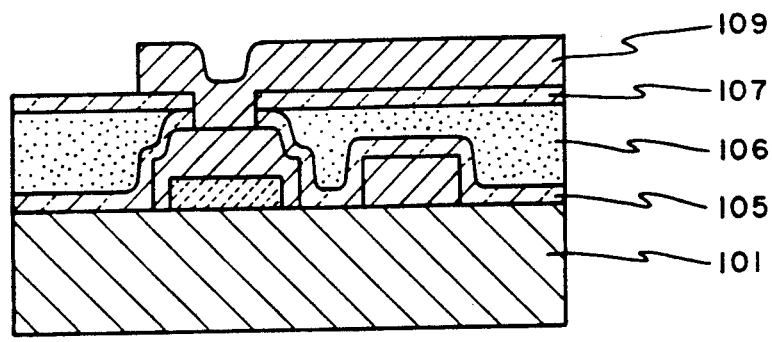
Figure 1E:
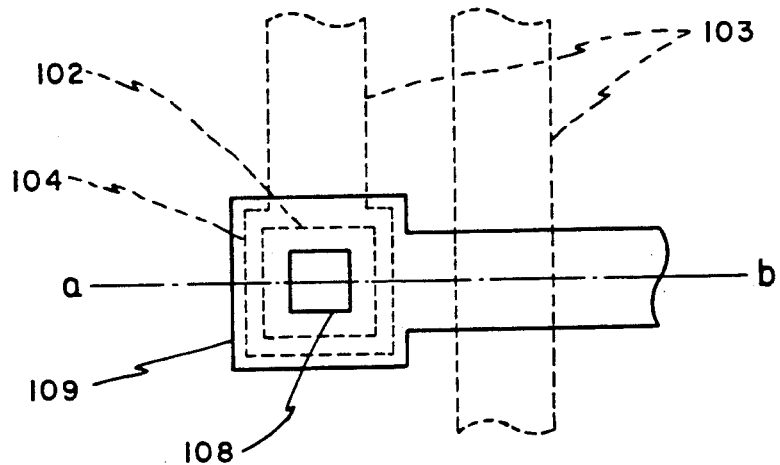
FIG. 1(E) is a plan view of the first embodiment of the present invention, FIGS. 1(A)–(D) being sectional views taken on line a–b of FIG. 1(E), respectively.

In reference to FIG. 1(C), the through-hole 108 is bored by photoetching in the first interlevel insulating film 105 above the seat 104 and the second interlevel insulating film 107. The upper wiring layer 109 is subsequently formed as shown in FIG. 1(D). The film-forming properties (coverage) of the through-hole portion of the upper wiring layer 109 is improved because the thicknesses of the interlevel insulating films 105, 107 on the seat 104 are relatively less than that of the insulating film on the lower wiring layer 103 and because the through-hole 108 is shallow.

Figure 2:
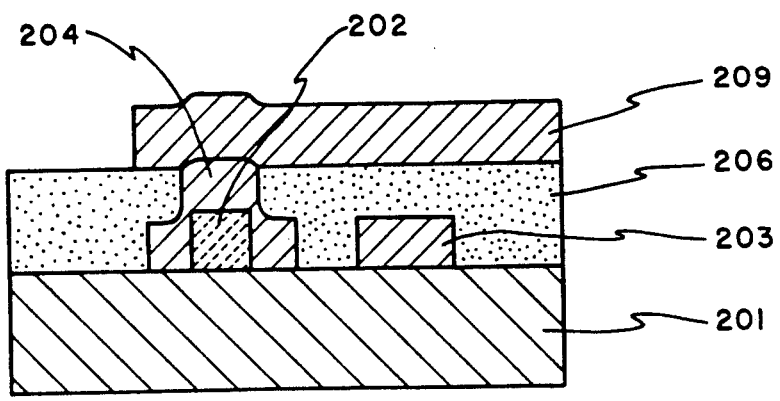
FIG. 2 is a vertical sectional view of a second embodiment of the present invention.

Referring to FIG. 2, a second embodiment of the present invention will subsequently be described. An interlevel insulating film 206 is formed in the portion where the upper and lower wiring layers are connected in such a manner that its thickness is greater than that of a lower wiring layer 203. Then the lower wiring layer 203 simultaneously with a seat 204 formed by photoetching is formed in the portion where the upper and lower wiring layers are connected. In this case, the surface of the seat 204 in the connection between the upper and lower layers is exposed out of the interlevel insulating film 206. The lower and upper wiring layers are made connectable by forming an upper wiring layer 209 on the seat 204.

In this embodiment, flat multilayer wiring can be materialized by the conventional method of forming multilayer wiring without changing the number of photolithographic processing steps.

What is claimed is:

1. A method for forming multilayer wirings on a semiconductor device, comprising steps of forming a first seat formed of a first conductor in a portion where a lower wiring layer and an upper wiring layer on a semiconductor substrate are to be connected; forming a second conductor on said semiconductor substrate and said first seat; forming said lower wiring layer formed of said second conductor by selectively removing said second conductor simultaneously with the formation of a second seat formed of said second conductor on said first seat; forming by a chemical vapor deposition method a first interlevel insulating film on said semiconductor substrate, on said second seat and on said lower wiring layer; forming by a coating method a second interlevel insulating film on said first interlevel insulating film; forming a hole exposing said second seat in said first and second interlevel insulating films; and forming the upper wiring layer to be connected to said second seat via said hole on said second interlevel insulating film.

2. A method for forming multilayer wirings on a semiconductor device as claimed in claim 1, wherein said first interlevel insulating film is a silicon nitride film or silicon oxide film, said second interlevel insulating film being a glass or organic compound film.

3. A method for forming multilayer wirings on a semiconductor device as claimed in claim 1, wherein said first and second conductors are made of Al or Al—Cu alloy.

4. A method for forming multilayer wirings on a semiconductor device, comprising steps of forming a first seat formed of a first conductor in a portion where a lower wiring layer and an upper wiring layer on a semiconductor substrate are to be connected; forming a second conductor on said semiconductor substrate and said first seat; forming said lower wiring layer formed of said second conductor by selectively removing said second conductor simultaneously with the formation of a second seat formed of a said second conductor on said first seat; forming by a chemical vapor deposition method a first interlevel insulating film on said semiconductor substrate on said second seat and on said lower wiring layer; forming by a coating method a second interlevel insulating film on said first interlevel insulating film; forming by a chemical vapor deposition method a third interlevel insulating film on said second interlevel insulating film; forming a hole exposing said second seat in said first, second and third interlevel insulating films; and forming the upper wiring layer to be connected to said second seat via said hole on said third interlevel insulating film.

5. A method for forming multilayer wirings on a semiconductor device as claimed in claim 4, wherein said first and third interlevel insulating films are silicon nitride film or silicon oxide films, said second interlevel insulating film being a glass or organic compound film.

6. A method for forming multilayer wirings on a semiconductor device as claimed in claim 4, wherein said first and second conductors are made of Al or Al—Cu alloy.

* * * * *